US 7,824,977 B2

(12) United States Patent
Hu et al.

(10) Patent No.: US 7,824,977 B2
(45) Date of Patent: Nov. 2, 2010

(54) COMPLETELY DECOUPLED HIGH VOLTAGE AND LOW VOLTAGE TRANSISTOR MANUFACTURING PROCESSES

(75) Inventors: YongZhong Hu, Cupertino, CA (US); Sung-Shan Tai, San Jose, CA (US)

(73) Assignee: Alpha & Omega Semiconductor, Ltd. (BM)

( * ) Notice: Subject to any disclaimer, the term of this patent is extended or adjusted under 35 U.S.C. 154(b) by 497 days.

(21) Appl. No.: 11/729,408

(22) Filed: Mar. 27, 2007

(65) Prior Publication Data

US 2008/0237777 A1    Oct. 2, 2008

(51) Int. Cl.
*H01L 29/00* (2006.01)

(52) U.S. Cl. .................. 438/218; 438/427; 438/207; 438/353; 438/294; 438/232; 438/341; 438/261; 257/500; 257/E29.125; 257/E29.131; 257/E29.134; 257/E29.275; 257/E29.319

(58) Field of Classification Search .......... 257/500, 257/E21.584, E29.125, E29.131, E29.138, 257/E29.275, E29.319, E29; 438/275, 201, 438/981, 218, 207, 400, 427, 219
See application file for complete search history.

(56) References Cited

U.S. PATENT DOCUMENTS

| 6,177,362 | B1 * | 1/2001 | Huang et al. | 438/787 |
| 6,828,183 | B1 * | 12/2004 | Sung et al. | 438/201 |
| 2005/0059215 | A1 * | 3/2005 | Kim et al. | 438/275 |

* cited by examiner

*Primary Examiner*—Wael M Fahmy
*Assistant Examiner*—Marc Armand
(74) *Attorney, Agent, or Firm*—Bo-In Lin

(57) ABSTRACT

A semiconductor wafer includes at least a partially manufactured high voltage transistor covered by a high-voltage low voltage decoupling layer and at least a partially manufactured low voltage transistor with the high-voltage low-voltage decoupling layer etched off for further performance of a low-voltage manufacturing process thereon. The high-voltage low-voltage decoupling layer comprising a high temperature oxide (HTO) oxide layer of about 30-150 Angstroms and a low-pressure chemical vapor deposition (LPCVD) nitride layer.

3 Claims, 9 Drawing Sheets

COMPLETELY DECOUPLED HIGH VOLTAGE AND LOW VOLTAGE TRANSISTOR MANUFACTURING PROCESSES

BACKGROUND OF THE INVENTION

1. Field of the Invention

The invention relates generally to a device configuration and manufacturing processes. More particularly, this invention relates to manufacturing processes enhanced by particular isolation/insulation structure to allow for completely decoupled high voltage and low voltage transistor manufacturing processes.

2. Description of the Relevant Art

The manufacturing processes and structural features of the high voltage and low voltage semiconductor devices are very different. Specifically, high voltage devices such as LDMOS, HV NMOS, HV PMOS transistors, HV PNP and HV NPN are structured with device components having larger dimensions on a wafer and die. The manufacturing processes for these devices require generally non-critical mask layers such as buried layer, high voltage (HV) wells, body regions, and first-polysilicon (1P) gates. In contrast, the low voltage devices such as low voltage CMOS transistors are manufactured with higher density. Therefore, the packing density of such devices within a die is of primary concern. In order to address such design issues, the low voltage transistors require the use of critical mask layers such as the second poly gate, contact, metal and via masks. The differences of dimensions and geometrical precision requirements between the high voltage and low voltage circuits can be as much as one order of magnitude. Such differences in structural features that may include the dimensional and precision control differences and also the difference of manufacturing processes significant increase the difficulties in attempt to integrate the low voltage and high voltage device on the same wafer. Further, the process for high voltage devices usually requires high temperature and long thermal cycles. Such high temperature long thermal process requirement would ruin the low voltage devices and process that is built on the same wafer.

In the meantime, there are ever increasing demands for routinely integrating the low voltage and high voltage device on the same wafer driven by the trend of SOC (System on Chip). Such integration provides the benefits of miniaturization, lower energy consumption and high level of functional integration.

According to above integrated device configurations and manufacturing processes, for manufacturing a HV-LV integrated device, the low voltage semiconductor manufacturing processes must be applied because the more dominated and more stringent requirements of the low voltage devices. For this reason, the production costs are increased due to the facts higher precision of alignment and control would also apply to the HV device structure and process that would otherwise be using lower precision of alignment and control. High temperature and long thermal cycles also prevent the integrations of many low voltage structures into HV structure.

Therefore, a need still exists in the fields of circuit design and device manufactures for providing a new and improved configuration and manufacturing method to resolve the above-discussed difficulties. Specifically, a need still exists to provide new and improved configuration to such that the manufacturing processes of the high voltage device is not subject to the requirements of the low voltage devices such that the unnecessary processing complications and increase of costs that usually occur in integrating the HV-LV transistors on the same wafer can be circumvented.

SUMMARY OF THE PRESENT INVENTION

It is therefore an aspect of the present invention to provide a new and improved high-voltage and low-voltage decoupling and isolation structure with decoupling manufacturing processes such that the above-discussed difficulties and limitations encountered by the conventional HV-LV integration manufacturing processes can be overcome.

More specifically, one aspect of the present invention is to provide a new HV-LV decoupling structure by using decoupling layers such that the manufacturing of the HV and LV device are completely decoupled and can be carried out in two separate platforms. The high voltage device can be manufactured with non-critical processing procedures with one-micron or above technologies. The low voltage circuits are manufactured with critical processing steps applying sub-micron or below technologies.

Another aspect of this invention is to provide a new HV-LV decoupling structure by using decoupling layers such that the manufacturing of the HV and LV device are completely decoupled and can be carried out in two separate manufacturing plants, e.g., two semiconductor foundries. The high voltage device can be manufactured at a low cost and low end manufacturing plant carrying out the non-critical processing procedures with one-micron or above technologies. The low voltage circuits are manufactured in another high-end fabrication plant for carrying out the critical processing steps by applying sub-micron or below technologies.

Briefly in a preferred embodiment this invention discloses an electronic device that includes at least a high voltage transistor and a low voltage transistor supported on a same wafer wherein the low voltage transistor having a packing density approximately ten times higher than the high voltage transistor. In an exemplary embodiment, the high voltage transistor includes a LDMOS transistor and the low voltage transistor includes a CMOS transistor supported on a same wafer. In another exemplary embodiment, the high voltage transistor includes a high voltage NMOS transistor and the low voltage transistor includes a CMOS transistor supported on a same wafer. In another exemplary embodiment, the high voltage transistor includes a high voltage PMOS transistor and the low voltage transistor includes a CMOS transistor supported on a same wafer. In another exemplary embodiment, the high voltage transistor includes a high voltage PNP transistor and the low voltage transistor includes a CMOS transistor supported on a same wafer. In another exemplary embodiment, the high voltage transistor includes a high voltage NPN transistor and the low voltage transistor includes a CMOS transistor supported on a same wafer. In another exemplary embodiment, the high voltage transistor includes a high voltage bipolar junction transistor (BJT) and the low voltage transistor includes a CMOS transistor supported on a same wafer. In another exemplary embodiment, the high voltage transistor includes a high voltage well, a body region and a polysilicon gate and the low voltage transistor includes a low voltage well. In another exemplary embodiment, the high voltage transistor includes a high voltage well; a body region and a polysilicon gate wherein the polysilicon gate further includes a HV-LV decoupling layer as etched-off sidewall surrounding the polysilicon gate. In another exemplary embodiment, the low voltage transistor further includes a low voltage gate and low voltage source and body regions. In another exemplary embodiment, the low voltage transistor further includes a low voltage gate and low voltage source and drain regions and a standard CMOS BEOL with multiple metal layers (ML) and multiple inter layer dielectric (ILD) layers with a trenched contact opened through the ILD layers to provide electrical contact to the source and drain regions. In another exemplary embodiment, the high voltage transistor having a line width ranging from 0.5 to 10 micrometers and the low voltage transistor supported on a same wafer having a line width less than 0.5 micrometers. In another exemplary embodiment, the high voltage transistor is provided to operate at a voltage ranging substantially from 5 to several hundreds volts or even higher and the low voltage transistor supported on a same wafer is provided for operating lower than 5 volts.

The present invention further discloses a method for manufacturing an electronic device with an integrated high-voltage and low-voltage transistors on a same wafer. The method includes a step of forming a high-voltage low voltage decoupling layer to cover a partially manufactured high voltage transistor and etching off the high-voltage low-voltage decoupling layer from a partially manufactured low voltage transistor for further performing a low-voltage manufacturing process thereon. In an exemplary embodiment, the step of forming the high-voltage low-voltage decoupling layer includes a step of forming a high temperature oxide (HTO) oxide layer of about 30-150 Angstroms and a low-pressure chemical vapor deposition (LPCVD) nitride layer to cover the partially manufactured high voltage transistor These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figures 1, 1A:
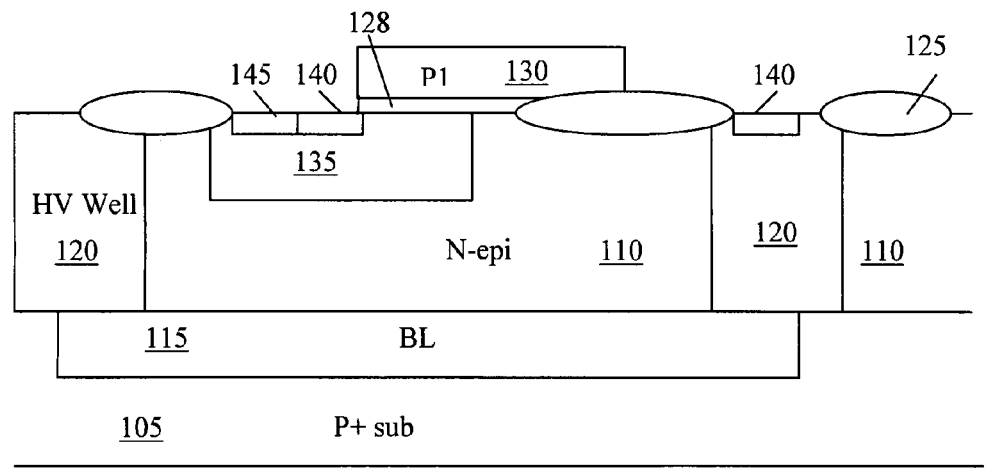
FIGS. 1A-1, 1A-2 and 1A to 1F-1, 1F-2 and 1F are series of cross sectional views for illustrating the manufacturing processes with completely decoupled high voltage LDMOS and BJT devices integrated with a low voltage transistor on the same wafer.
Figures 1, 1A, 2:
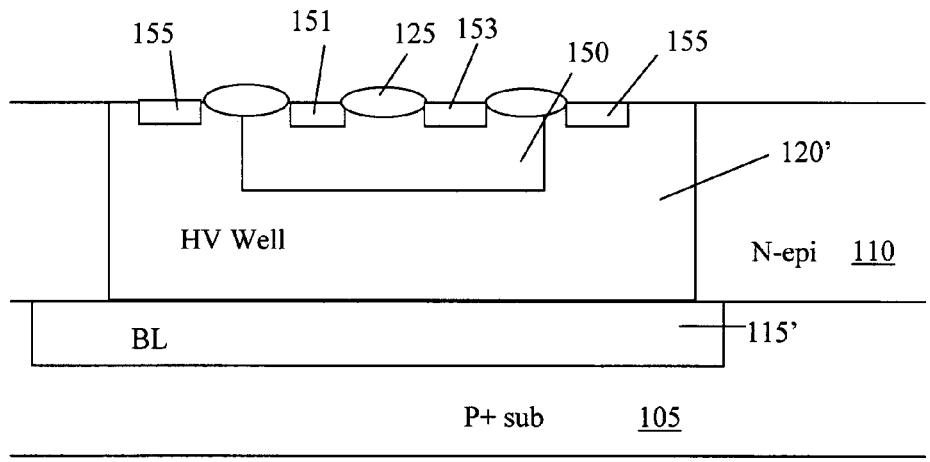
Figure 1A:
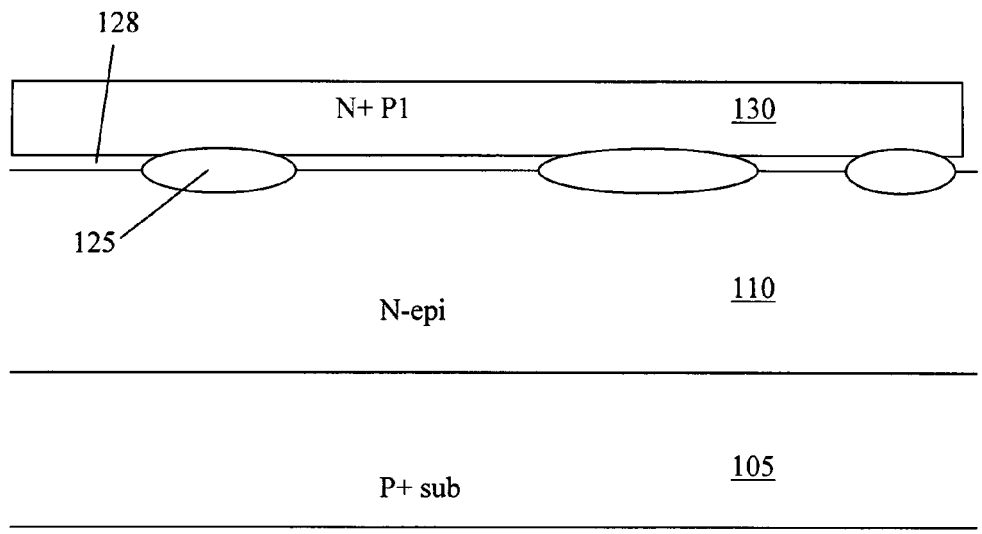

Referring to FIGS. 1A-1, 1A-2 are two side cross sectional view for illustrating the manufacturing processes of a LDMOS transistor and a Bipolar junction transistor (BJT) as high voltage device to integrate with a low voltage transistor with the manufacturing processes shown in the cross sectional view of FIG. 1A. As illustrated in FIGS. 1A-1 and 1A-2, the high voltage LDMOS and BJT device manufacturing process starts with a normal starting substrate 105, in this case a P+ substrate. A buried layer mask (not shown) is applied to implant a buried layer 115 and 115' followed by a diffusion process to form the buried layer for isolation purpose. Then an epitaxial layer 110 is grown. A high voltage well mask (not shown) is employed to implant the HV well 120 and 120' for the LDMOS and BJT respectively. Then an active mask (not shown) is employed to form a plurality of LOCOS regions 125 on the top surface of the epitaxial layer 110. A thick gate oxide layer 128 is formed followed by gate layer deposition and gate-etch processes with a gate mask (not shown) to form the gate segments 130 on the top surface of the device. Several processing steps are also carried out to form the HV device components. FIG. 1A-1 shows additional HV processes to form the LDMOS body region 135, the source and drain regions 140 and the body contact implant region 145. FIG. 1A-2 shows additional HV processes to form the bipolar base region 150, base contact implant region 151, emitter region 153 and collector regions 155 for the BJT device. The processes of growing epi layer 110, forming LOCOS 125, HV gate oxide 128 and gate layer 130 are also applied to the LV transistor area as shown in FIG. 1A.

Figures 1, 1B:
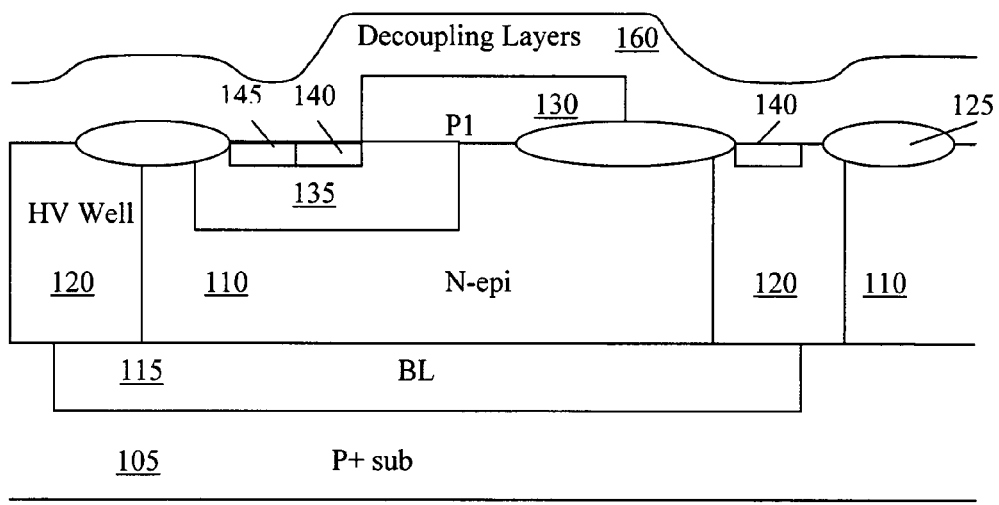
Figures 1, 1B, 2:
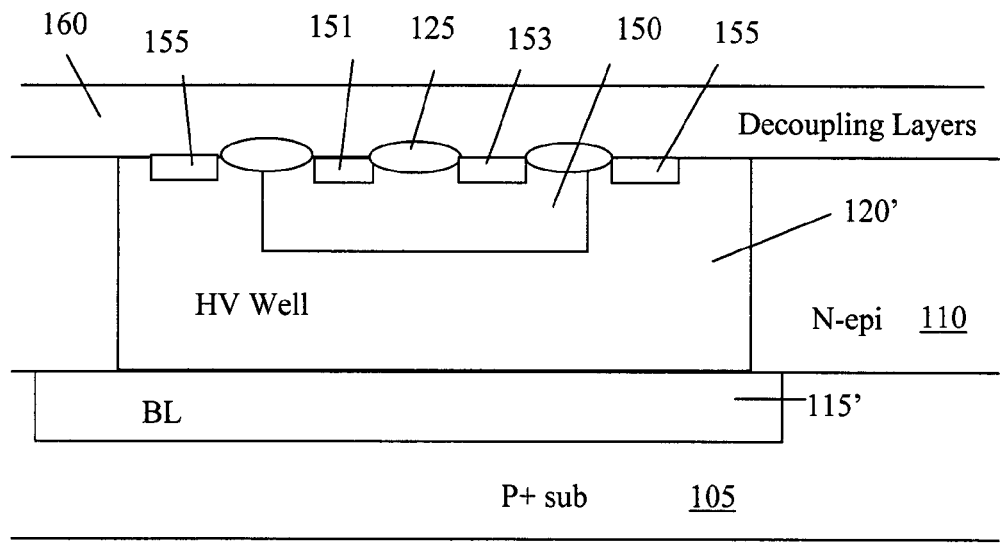
Figure 1B:
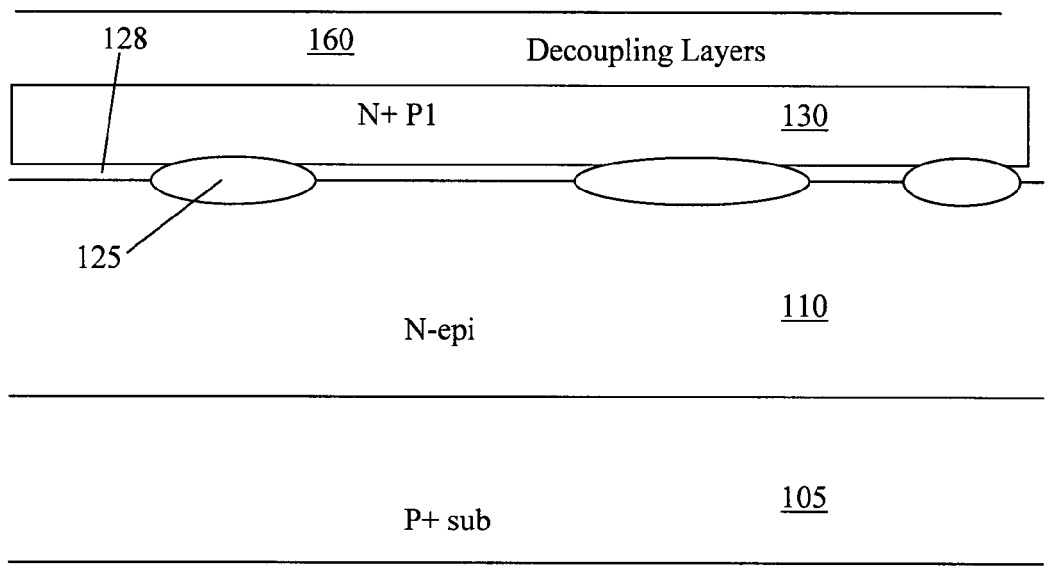
Figures 1, 1C:
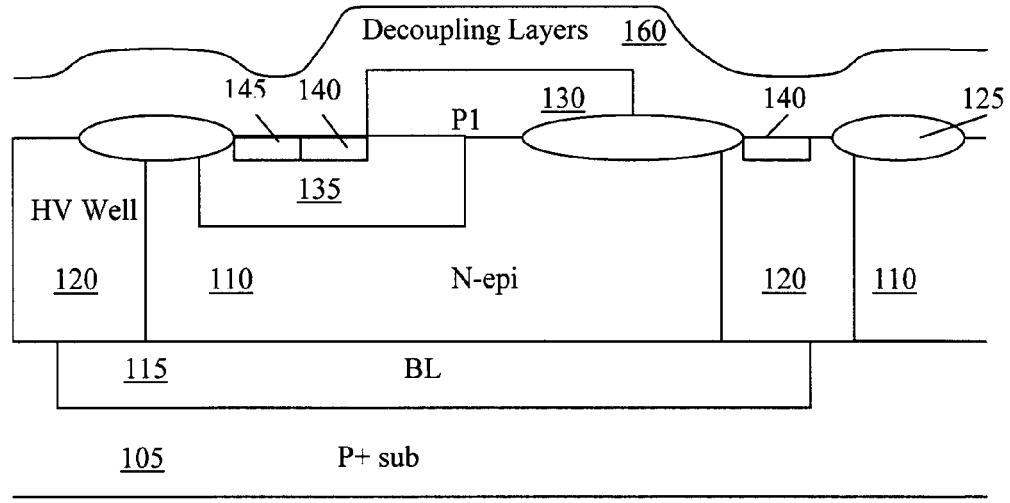
Figures 1, 1C, 2:
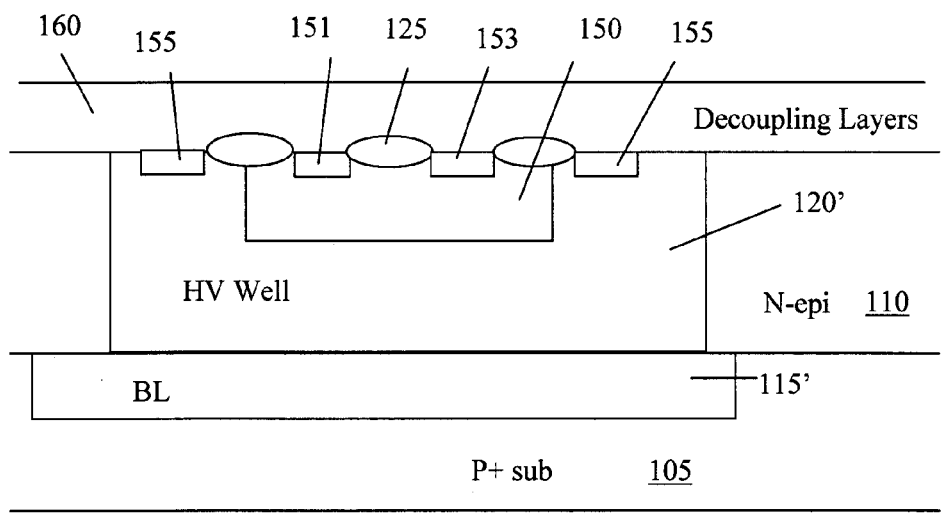
Figure 1C:
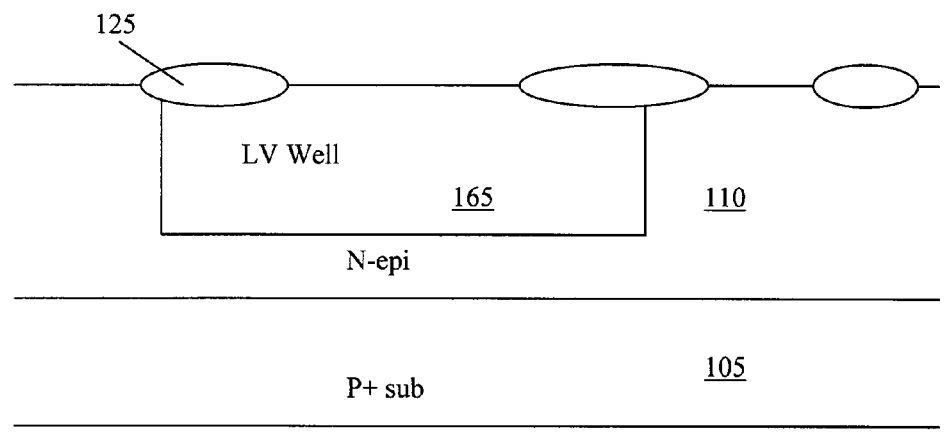
Figures 1, 1D:
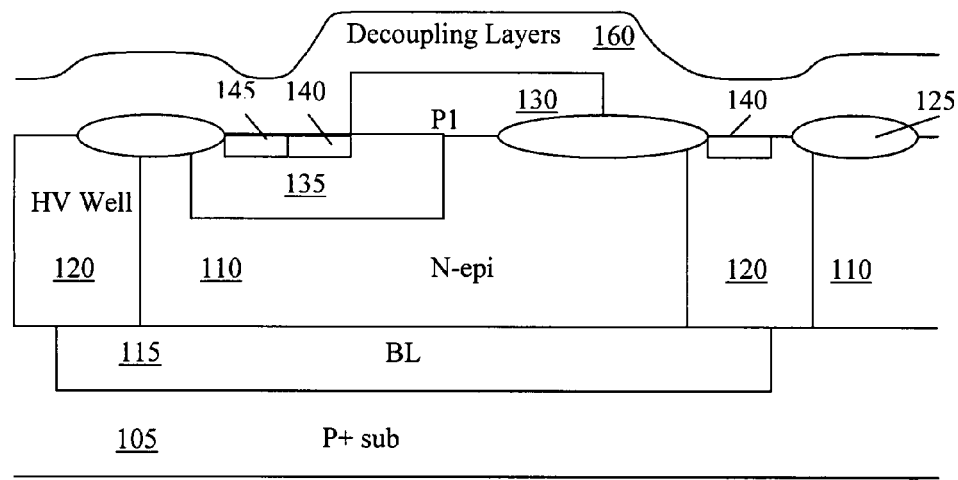
Figures 1, 1D, 2:
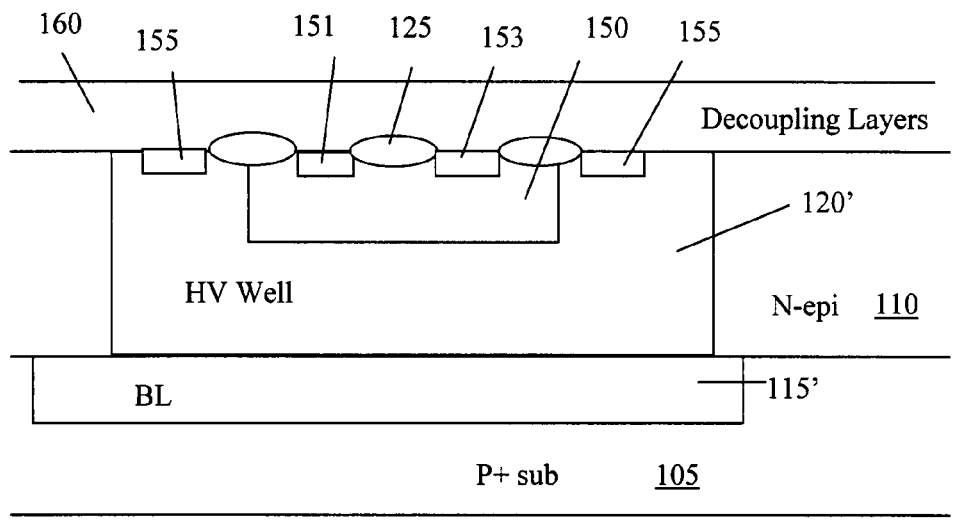
Figure 1D:
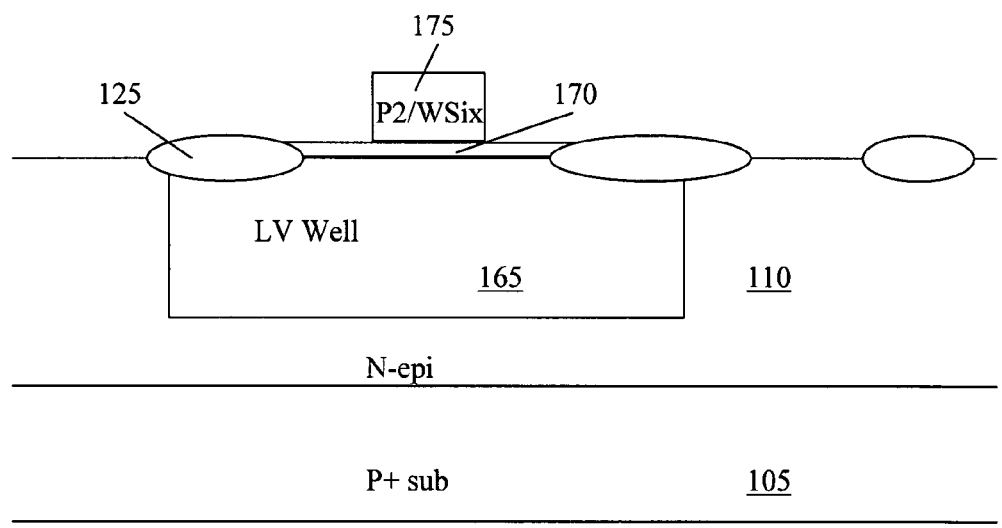

Referring to FIGS. 1B-1, 1B-2 and 1B, after the completion of the HV device processes, a high temperature oxide (HTO) oxide layer of about 30-150 Angstroms and a low-pressure chemical vapor deposition (LPCVD) nitride layer 160 are formed as a decoupling layer to decouple the HV and LV devices formed on the same wafer. The wafer may now be sent to another fab to continue with LV device manufacturing steps. As shown in FIG. 1C by applying a HV mask (not shown) the decoupling layer 160 and the gate segment 130 from the top of the LV device region. The decoupling layer 160 remains in the HV device areas as shown in FIGS. 1B-1 and 1B-2 to protect the HV devices from the effect of LV process. A LV well mask (not shown) is then applied to implant the LV well 165. In FIG. 1D, a LV gate oxide layer 170 is grown. Then, a second polysilicon deposition followed by POCL3 doping and WsiX deposition are carried out and a P2-gate mask (not shown) is applied to etch and pattern the LV gate 175.

Figures 1, 1E:
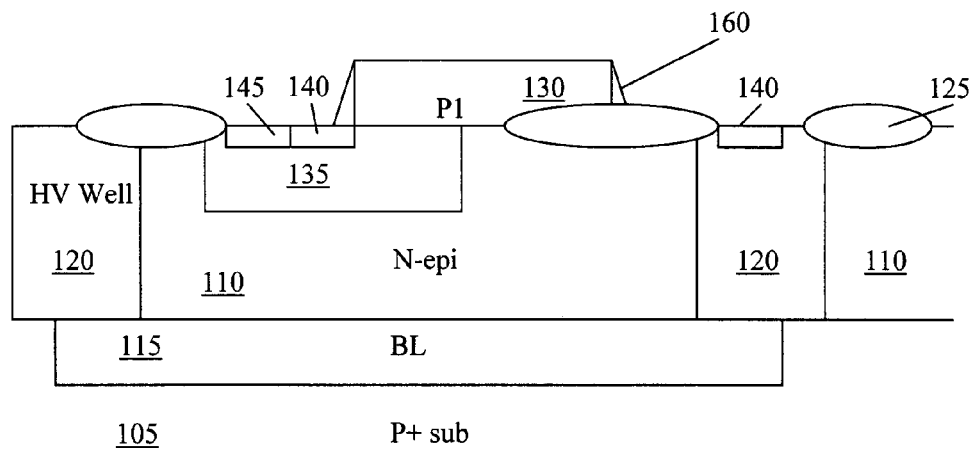
Figures 1, 1E, 2:
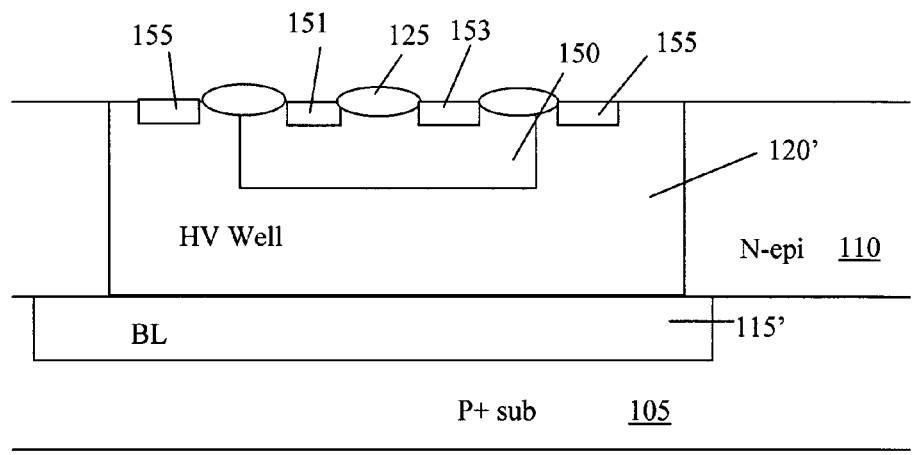
Figure 1E:
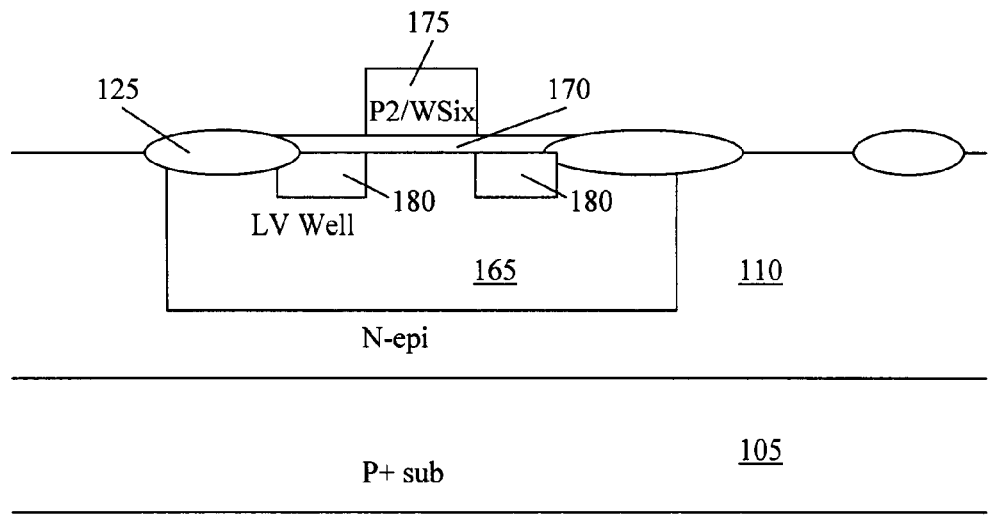
Figures 1, 1F:
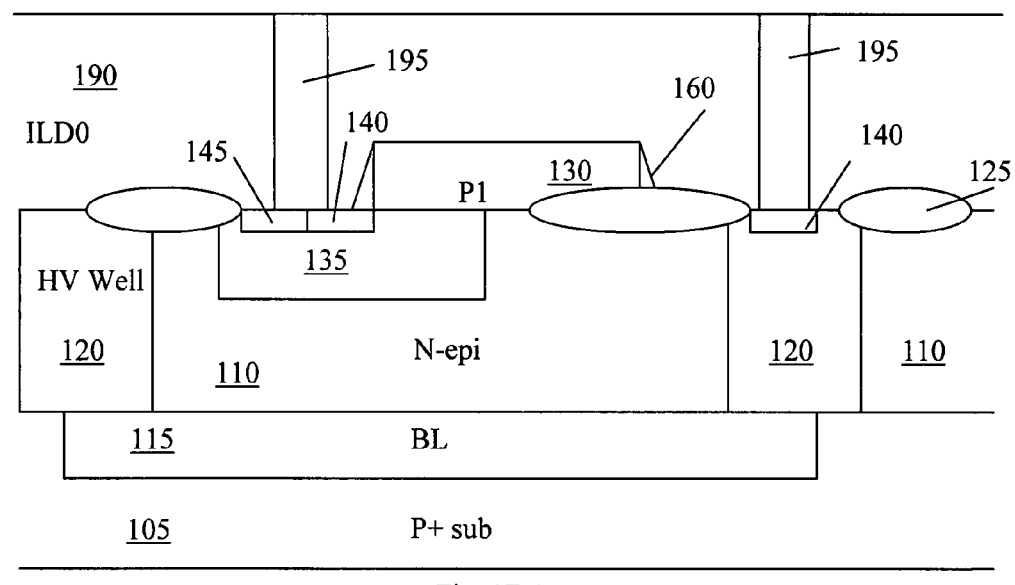
Figures 1, 1F, 2:
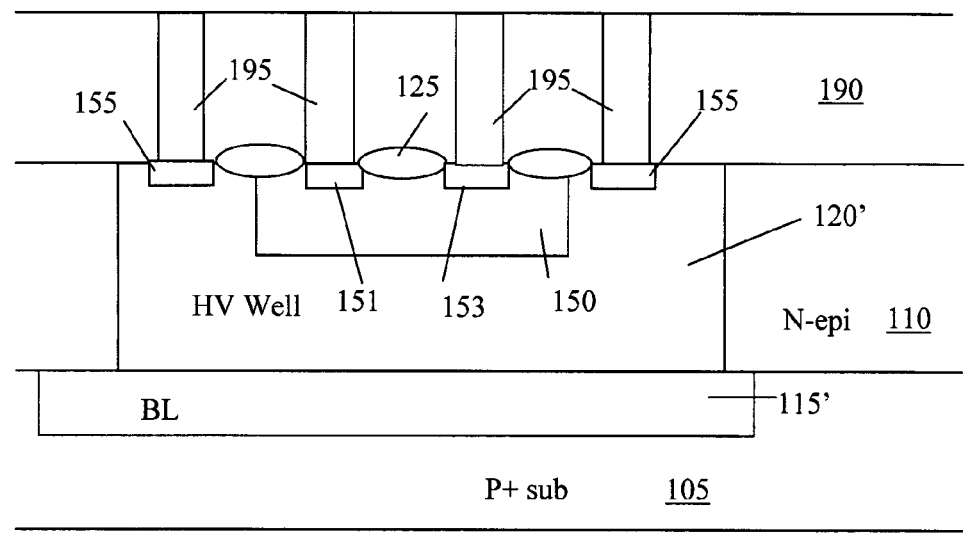
Figure 1F:
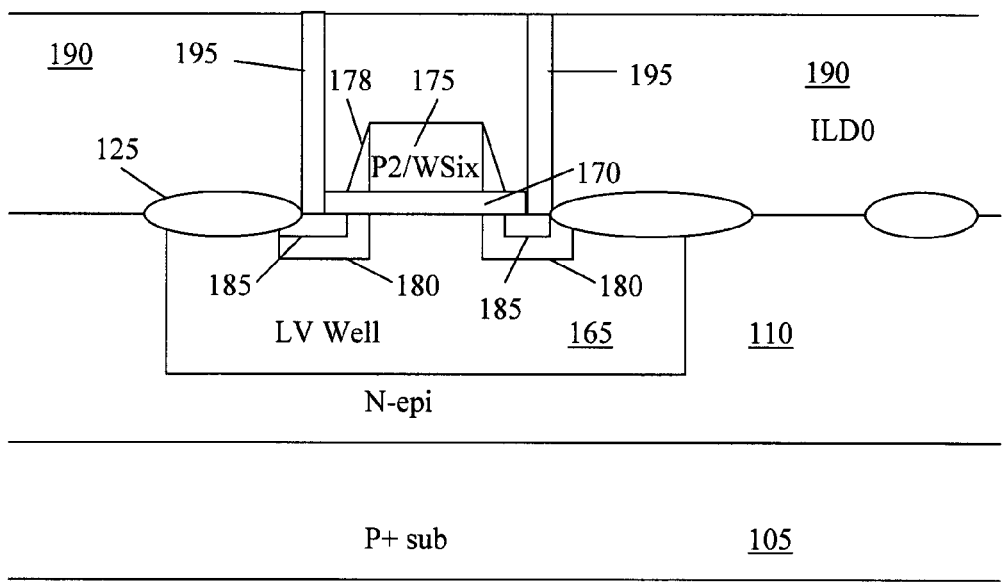

After the formation of the LV device gate manufacturing processes, a LV mask (not shown) is applied to etch and remove the decoupling layer 160 over the HV devices in FIG. 1E-1 and 1E-2, leaving a sidewall for surrounding the polysilicon gate 130 of the HV gate. Then, the LDD masks are employed to implant the LDD (Lightly Doped Drain) regions 180. In FIGS. 1F-1, 1F-2, and 1F, a spacer deposition is carried out followed by an etch process to form the sidewall isolation layer 178 surrounding the gate 175. The source and drain masks (not shown) are applied to implant the source-drain regions 185 in the LDD regions 180 followed by the source drain Ti silicidation process to improve conductivity. Then standard CMOS back end of line (BEOL) with two to three metal layer (ML) processes are carried out to form contact metals over the ILD0 layer 190 with trenched contact 195 opened through the ILD0 layer 190 to provide electrical contact to the source and drain regions.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing an electronic device on a semiconductor wafer comprising:

completing manufacturing processes of a high voltage transistor first with all functional components except a top side insulation layer and connections therethrough for the high voltage transistor then forming a high-voltage low voltage decoupling layer to cover all the functional components over an extended area of the high voltage transistor and a partially manufactured low voltage transistor followed by etching off said high-voltage low-voltage decoupling layer from the partially manufactured low voltage transistor while keeping the high-voltage-low-voltage decoupling layer covering over all the functional components of the high voltage transistor for further performing a low-voltage manufacturing process thereon.

2. The method of claim 1 wherein:
said step of forming said high-voltage low-voltage decoupling layer comprising a step of forming a high temperature oxide (HTO) oxide layer of about 30-150 Angstroms and a low-pressure chemical vapor deposition (LPCVD) nitride layer to cover the extended area over all the functional components of said high voltage transistor.

3. The method of claim 1 wherein:
said step of completing the manufacturing processes of said high voltage transistor comprising a step of completing the manufacturing processes of all the functional components of a LDMOS transistor and said step of manufacturing said low voltage transistor comprising steps of manufacturing a CMOS transistor supported on a same wafer while the high-voltage-low-voltage decoupling layer covering over all the functional components of the high voltage transistor.

\* \* \* \* \*